United States Patent [19]

Sibley

[11] Patent Number: 5,538,230
[45] Date of Patent: Jul. 23, 1996

[54] SILICON CARBIDE CARRIER FOR WAFER PROCESSING

[76] Inventor: Thomas Sibley, 5439 McCommas, Dallas, Tex. 75206

[21] Appl. No.: 286,942

[22] Filed: Aug. 8, 1994

[51] Int. Cl.⁶ .................................................. B23Q 3/00
[52] U.S. Cl. .......................................... 269/296; 211/41
[58] Field of Search .............................. 211/41; 206/454; 118/500; 432/253; 134/902, 201; 269/296, 289 R, 903, 43, 286

[56] References Cited

U.S. PATENT DOCUMENTS

| | | | |
|---|---|---|---|
| 3,486,631 | 12/1969 | Rodman | 211/41 |
| 4,093,201 | 6/1978 | Dietze et al. | 211/41 |
| 5,193,682 | 3/1993 | Naito et al. | 211/41 |
| 5,318,190 | 6/1994 | Mason | 211/41 |

FOREIGN PATENT DOCUMENTS

| | | | |
|---|---|---|---|
| 2662347 | 11/1991 | France | 211/41 |

*Primary Examiner*—Robert C. Watson
*Attorney, Agent, or Firm*—Gary C. Honeycutt

[57] ABSTRACT

A single piece, high purity, full density semiconductor wafer holding fixture for holding a multiplicity of wafers and consisting essentially of chemical vapor deposited silicon carbide (CVD SiC). The wafer carrier is advantageous for the fabrication of electronic integrated circuits where high temperatures and/or corrosive chemicals present, where dimensional stability of the holder is advantageous to the process or where introduction of contaminating elements is deleterious to the process. The method for making such an article comprises shaping a substrate, e.g. graphite, which on one surface has the form of the desired shape, said form comprising raised longitudinal sections to support the silicon wafers at the edges of the wafers, chemically vapor depositing a layer of silicon carbide onto the substrate, removing the substrate intact or by burning, machining, grinding, gritblasting and/or dissolving, and grinding the silicon carbide in any areas where a more precise dimension is required.

11 Claims, 5 Drawing Sheets

SILICON CARBIDE CARRIER FOR WAFER PROCESSING

FIELD OF THE INVENTION

The invention relates to fixtures or carriers ("boats") used in the manufacture of semiconductor devices such as diodes, transistors and integrated circuits. More particularly, the invention relates to silicon carbide carriers that are used in semiconductor fabrication processes that require the use of high temperatures and/or corrosive fluids. The carriers are used in chemical or thermal processing of semiconductor wafers, in horizontal processing equipment, at ambient or elevated temperatures, in vacuum, gaseous or liquid processing environments.

BACKGROUND OF THE INVENTION

The requirements for cleanliness and the elimination of contaminants in the processing of semiconductor wafers are well documented; see, for example U.S. Pat. Nos. 3,951,541, 3,962,391, 4,093,201, 4,203,940, 4,761,134, 4,978,567, 4,987,016, and Japanese Patent Publication JP 50-90184. To maintain extremely high purity during processing, it is known that such fixtures should be totally free of contaminants, to the extent commercially feasible. It is also known that the carriers should be stable at elevated temperatures, and when subjected to corrosive or oxidizing conditions. Typical Corrosive or oxidizing conditions to which the carriers should remain inert are set forth in U.S. Pat. Nos. 4,987,016 and 4,761,134.

Quartz has been and continues to be the most common material used for these components and fixtures. However, quartz has certain deficiencies, such as structural weakness at high temperatures, susceptibility to etching by commonly used acids, and a coefficient of thermal expansion that differs from that of certain materials which are deposited thereon during normal use.

The prior art discussed below addresses the construction of silicon carbide (SIC) boats which have thus far had the most commercial success—a porous SiC formed by casting. These references disclose the drawbacks of quartz, and the benefits of using SiC. They also disclose the drawbacks of the casting method of producing SiC boats. In order to avoid the deficiencies of porous SiC, prior art methods apply a SiC coating layer by chemical vapor deposition (CVD) over the cast SiC. However, an overcoat of CVD SiC does not completely eliminate the problems with porous SiC, since the coating can crack or chip, and thereby expose the porous SiC. Thus, a carrier that consists entirely of CVD SiC is preferred, thus avoiding the problems of porous SiC.

A number of attempts have been made to improve on quartz. The most successful is a porous silicon carbide infiltrated with silicon, disclosed in U.S. Pat. No. 3,951,587. The problem with such a carrier is that the silicon can etch out when exposed to commonly used cleaning solutions, e.g., strong acids, such as nitric acid, illustrated in U.S. Pat. No. 4,761,134. Other workers (see U.S. Pat. No. 4,761,134) propose to solve this problem by applying an impervious coating, generally a chemical vapor deposited silicon carbide (CVD SiC) coating on the surface of the silicon-filled silicon carbide, or on a porous silicon carbide that has not been filled with silicon (see U.S. Pat. No. 4,987,016). The drawback to these approaches is that any chip, break or crack in the coating will expose the undesirable substrate. U.S. Pat. No. 4,761,134 discusses this drawback as it pertains to CVD SiC applied on an unfilled porous SiC substrate. However, the discussion neglects to point out that a similar weakness is inherent in the approach disclosed and claimed in this reference. U.S. Pat. No. 5,283,089 discloses depositing silicon carbide or silicon nitride onto a silicon carbide or silicon nitride matrix to form wafer boats and other components for semiconductor diffusion furnaces.

The preferred approach is to fabricate the carrier entirely from CVD SiC. In this approach, there is no possibility of a silicon-filled or porous substrate being exposed. The CVD SiC fixture also has the advantage of being cleaner than the cast and sintered, or reaction-bonded SiC carders disclosed in the previously cited references.

The following references describe carriers that are composed entirely of SiC. U.S. Pat. No. 4,978,567 describes a CVD SiC fixture for processing a single wafer at a time, in a furnace designed to do single wafer processing. There is a strong need for a boat for batch processing, capable of holding from 25 to 50 or more wafers. The carrier described and claimed in U.S. Pat. No. 4,978,567 cannot be used for batch processing.

Japanese Patent Application No. JP 50-90184 describes a hollow beam made of CVD SiC to hold wafers. However, this device requires that three or four such beams be joined together by a means of support at the ends. While the boat described in JP 50-90184 fulfills the need for a boat that can hold a plurality of wafers during semiconductor processing, the boat is fragile and relatively complex, and hence costly to manufacture. There is a need for a carrier that uses a single piece of SiC to achieve the same result, and thus is stronger and more economical.

Japanese Patent Application No. Sho 55-82427 discloses a boat consisting of a single piece of silicon carbide, formed by CVD on a graphite substrate. However, the the boat has a rectangular cross-section, which is undesirable because it requires an inefficient use of furnace space. Moreover, the rectangular design causes the mass of the boat to be unnecessarily large, which adds excess thermal inertia, and distorts the thermal pattern developed in the wafers during processing. In diffusion processes, for example, the excess thermal mass of a boat can cause temperature variations across the wafer arena, and thereby alter diffusion patterns. Such variations cannot be offset by changes in process parameters. Still further, excess wafer area is covered by the slot walls or the connecting end members. In addition, the design includes partially enclosed areas that will distort gas flow patterns, and will increase the time required to exhaust gases contained in such partially enclosed areas.

JP 55-82427 also fails to reveal the size of the boat, relative to the size of the wafers to be carried. If the height of the boat is small relative to the wafers, the slots will not provide adequate horizontal support to maintain the wafers in a vertical position. If the height of the boat is large relative to the diameter of the wafers, adequate horizontal support will be provided, but the walls of the slots will then cover an excessive area of each wafer.

U.S. Pat. Nos. 3,962,391, 4,093,201 and 4,203,940 (all assigned to Siemens) describe methods for making carriers which hold a number of wafers and are produced by depositing CVD silicon or CVD silicon carbide on a generally cylindrical graphite form. However, these patents describe carriers that are not suitable for the most widely used wafer processes. The devices described in U.S. Pat. Nos. 3,962,391 and 4,093,201 do not have means for holding the wafers apart, with a uniform gap between each of the wafers which is required in most batch semiconductor processes. U.S. Pat.

No. 4,203,940 describes a carrier design that requires the grinding of slots in a silicon or silicon carbide form to provide means for holding the wafers apart with a gap between each pair of wafers. However, the design described in the latter patent allows only two narrow slots to hold each wafer.

Since two slots do not provide adequate wafer support, the industry has developed carriers having four support points to hold each wafer. This is beneficial in the processing of silicon wafers, since it allows the wafers to be held in a more uniform and more parallel position, while minimizing the wafer area covered by the support points. Minimizing the wafer area covered by the support points of the holder maximizes the area of the wafer available for productive use. The general guidelines for the design of these widely used wafer carriers is described in the SEMI International Standards, published by Semiconductor Equipment and Materials International, Mountain View, Calif. The information contained in these standards is incorporated herein by reference.

SUMMARY OF THE INVENTION

The present invention provides a horizontal CVD SiC wafer boat for use in the manufacture of semiconductor devices, including features that eliminate the disadvantages of the above-described structures, and having the added advantage of conforming with the dimensional requirements described generally in the aforementioned SEMI standards.

The preferred carrier of the present invention consists of a single piece of nonporous SiC having a uniform bulk density in excess of 3.18 grams per cubic centimeter (99% of maximum theoretical density), and a purity of at least 99.99%. It is configured as a generally cylindrical shell section having an average inner radius slightly greater than the radius of the wafers to be held. The generally concave inner surface of the carrier includes at least two longitudinally uniform convex portions wherein a plurality of orthogonal slots or grooves are located, to provide the necessary wafer support. Since the carrier is to be used in a horizontal position, each of the wafers is thereby supported in a vertical position, parallel to each other. In a preferred embodiment, the carrier walls have a substantially uniform thickness, except for the areas where the wafer slots are located. The slot areas of the carrier wall are preferably about one-half to three-fourths as thick as the remaining walls. This feature minimize is thermal interaction between the wafers and the carrier; and also reduces the amount of wafer surface covered by the slot walls.

The convex inner portions of the carrier need not have a single curvature. Instead, when two elongated wafer support slots are desired, the convex inner surface portions are shaped to include flat or slightly concave central segments, such that the slots provided therein have a uniformly shallow depth, whereby only a minimum area of the wafer edges are covered, after insertion into the slots. In such a configuration the lower end of each slot provides vertical and horizontal support, while the upper end of each slot provides only horizontal support, or alignment, to ensure a uniform parallel separation between adjacent wafers.

Both ends of the cylindrical section can be left open to form an open-ended carrier. Or, the ends can be closed to form a closed-end carrier. The outer surface of the shell may include one or more flattened sections to provide a stable base for the carrier. Or, parallel longitudinal external ridges may be provided on the outersurface of the shell to permit the carrier to be supported during processing by cantilever paddles, or other support means, or for lifting devices. Open areas may also be formed in the bottom or in the sides of the carrier, for gas circulation, or the draining of fluids used in cleaning or wet processing, or to reduce the mass of the carrier, or for other reasons, such as the insertion of a lifting device.

Another aspect of the invention is embodied in a process for making the carrier, which begins with the step of shaping the exterior of a substrate or mold, to provide the exact geometry required for the inside surface of the carrier. A graphite mold, for example, is shaped into the form of a cylindrical section, machined to provide a longitudinally elongated flattened area on its convex surface, and then further machined to provide one or more longitudinally uniform concave surfaces on each side of, and parallel to the flattened area. The mold is masked in areas where no deposition is desired.

Next, silicon carbide is formed on the mold surface, by chemical vapor deposition; and the resulting CVD shell is separated from the mold. The flattened area of the mold provides the flat bottom of the carrier, and the concave surfaces of the mold provide the convex inner portions of the shell. Orthogonal slots or grooves are machined into the convex inner portions, to provide wafer support points. Other features of the boat may also be shaped by grinding, such as the length and height, and the width of the bottom and base widths. Separation of the mold is usually achieved by destructively burning away the graphite, whereby only the deposited shell remains. Such grinding of the SiC may be performed before or after removing the mold, or, a combination of before and after.

DETAILED DESCRIPTION OF THE INVENTION

Figure 1:
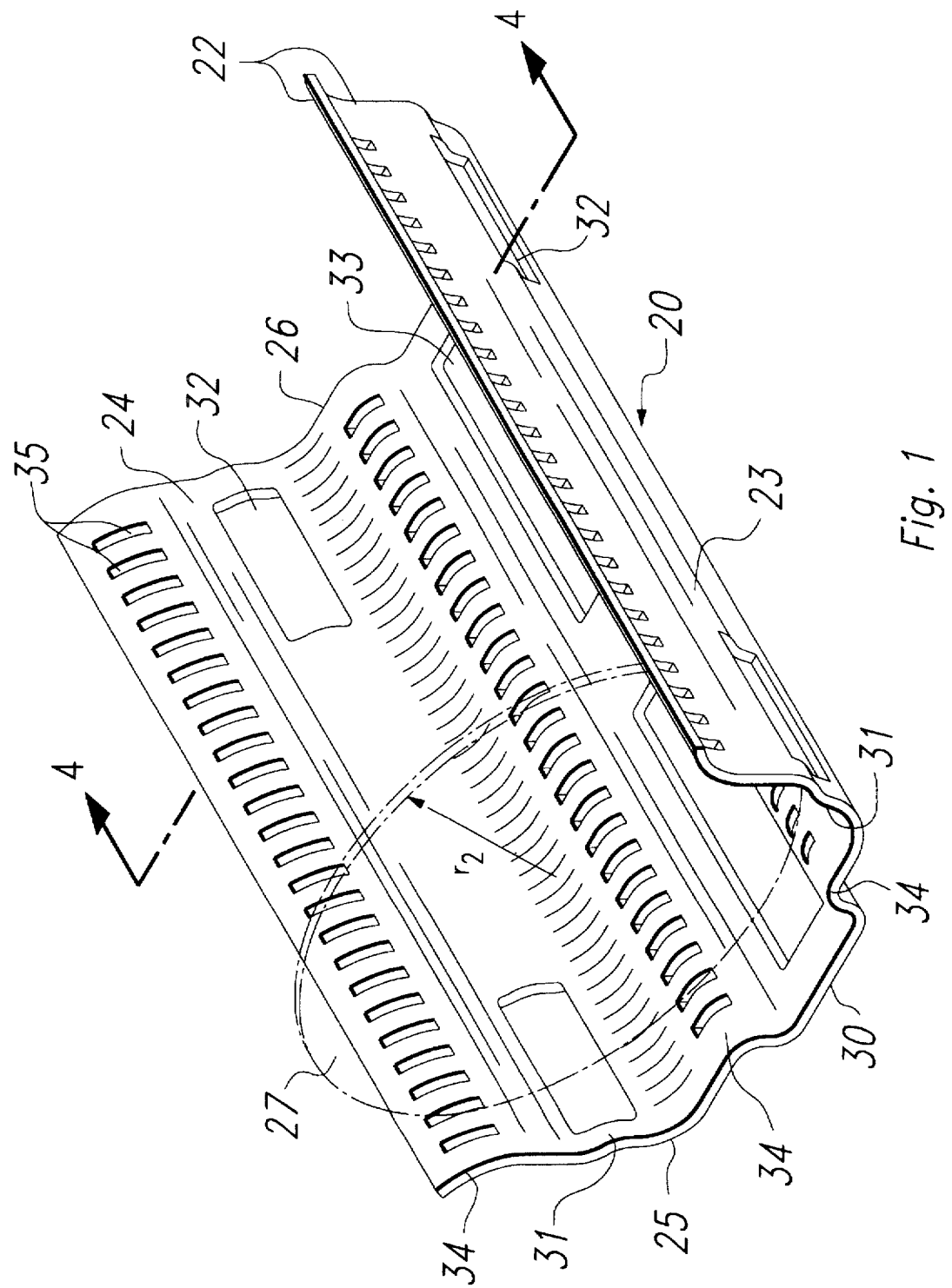
FIG. 1 is an isometric view of one embodiment of the present invention, an opened end wafer carrier having a flattened bottom, and open areas with a wafer shown in phantom.
Figure 4:
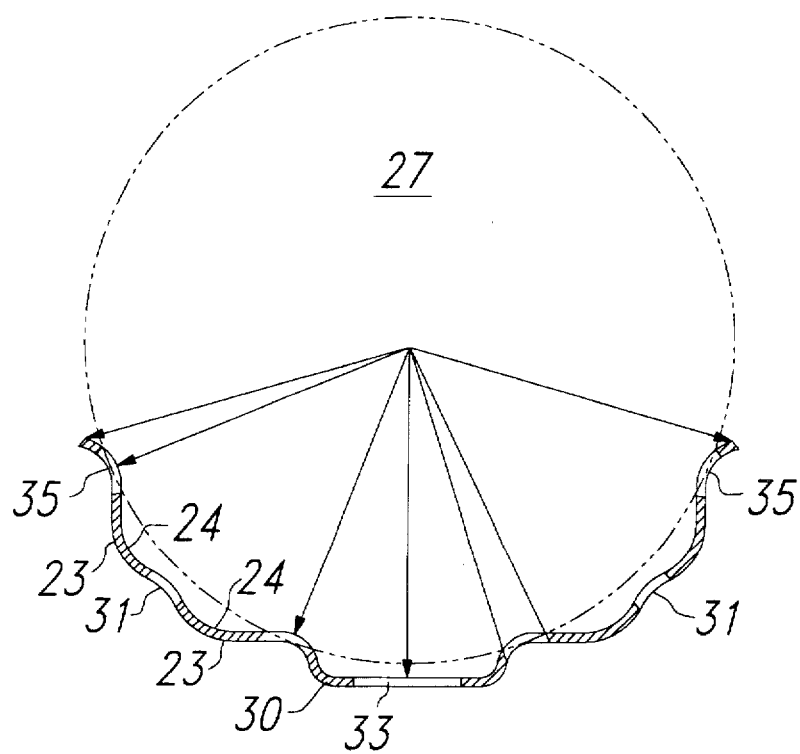
FIG. 4 is a cross sectional view taken along line 4—4 of the carrier shown in FIG. 1, with a wafer shown in phantom.

Referring now to FIGS. 1 and 4, boat 20 is shown comprising cylindrical shell section 22 having a thickness t, of chemical vapor deposited SiC and having outer convex surface 23, inner concave surface 24, open first end 25 and open second end 26.

Cylindrical shell 22, which makes up the major portion of boat 20, lies outside the radius of inner surface 24, r1, which is greater than the radius, r2, of wafer 27 to be supported. Cylindrical section 22 subtends an arc, i.e. angle α, ranging from approximately 90° to approximately 180°. The specific geometry of the portion of the boat lying outside radius r1 may take many forms, but generally has flat base 30 for resting boat 20 on a horizontal surface. Base 30 has a width, w, which may serve to position the boat in a semiconductor processing furnace and/or in devices for loading and unloading the wafers. Boat 20 shown in this embodiment also includes inward protrusions 31 having radius r5, which allows one to mount lifting devices for moving boat 20. Inward protrusions 31 may also be used to support boat 20 on a paddle, e.g. a conventional U-shaped paddle, or other devices which supports boat 20 at positions other than base 30. Cut outs 32 may be used to insert lifting devices from the side. Other cut outs 33 in base 30 are used to permit the flow of process gases as well as to decrease the weight of boat 20 by removing unnecessary mass.

Boat 20 has four slot-containing inwardly convex surfaces 34 which extend toward the wafer center to a distance r3. Surfaces 34 are provided with a plurality of grooves or slots 35 into which the wafers are placed. The bottom or outermost radius, r4, of slots 35 is slightly larger than the r2 of the wafers to be supported, as is typical of the slotting of wafer boats in the industry.

The length, L, of slots 35 is calculated by determining the angle, θ, subtended by the slots. In the carriers of this invention, θ ranges from approximately 5° to approximately 60°. L must increase and hence θθ must increase if a wafer carrier has only two slot-containing inwardly extending surfaces. In this case, each of the slots subtends an arc, i.e. angle θ, ranging from approximately 20° to approximately 60°.

Figure 2:
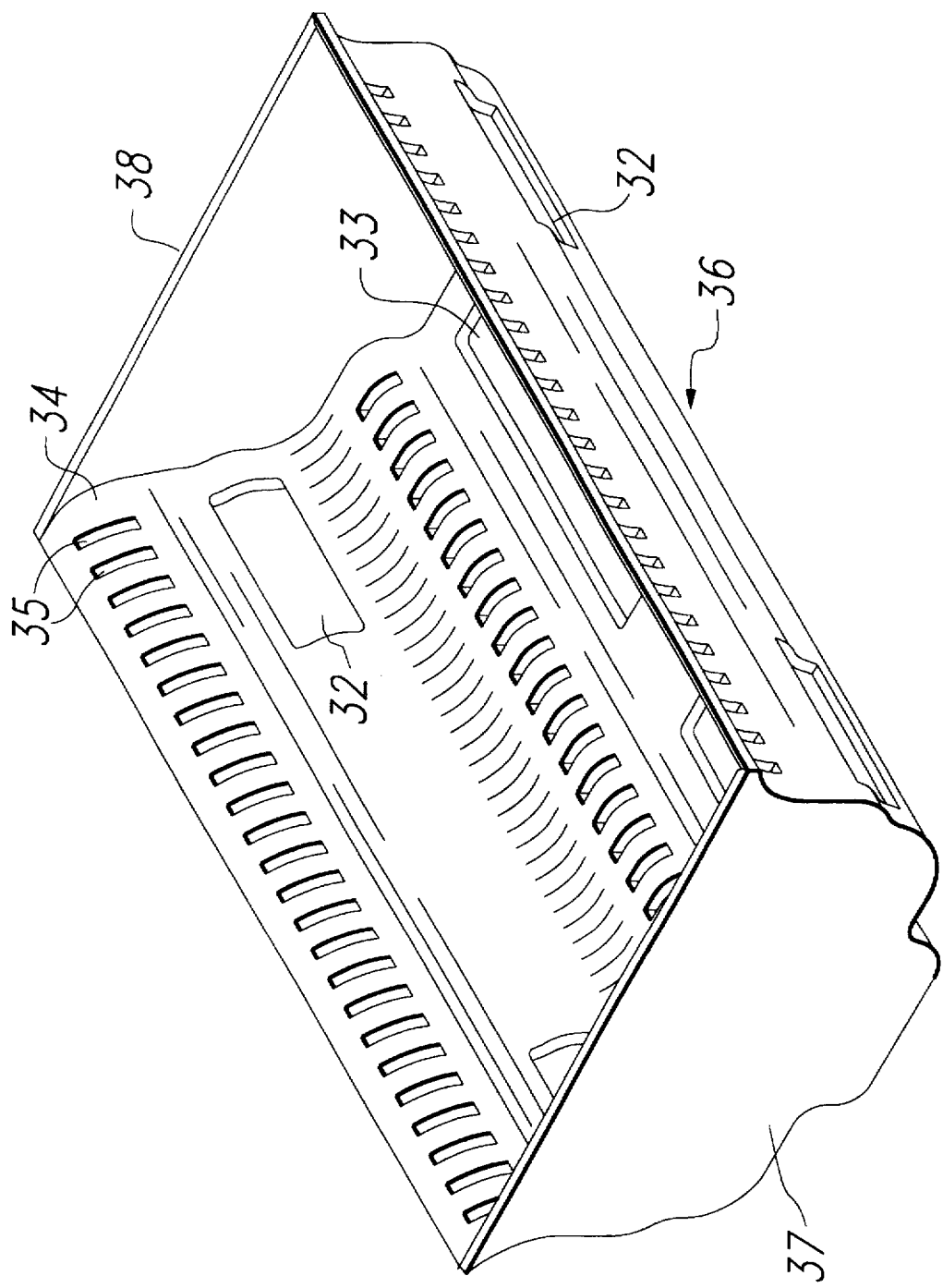
FIG. 2 is an isometric view of another embodiment of the present invention, a closed end wafer carrier having a flattened bottom and open areas.

FIG. 2 illustrates boat 36 which is identical to boat 20 shown in FIG. 1 except that it has closed first end 37 and closed second end 38.

Figure 3:
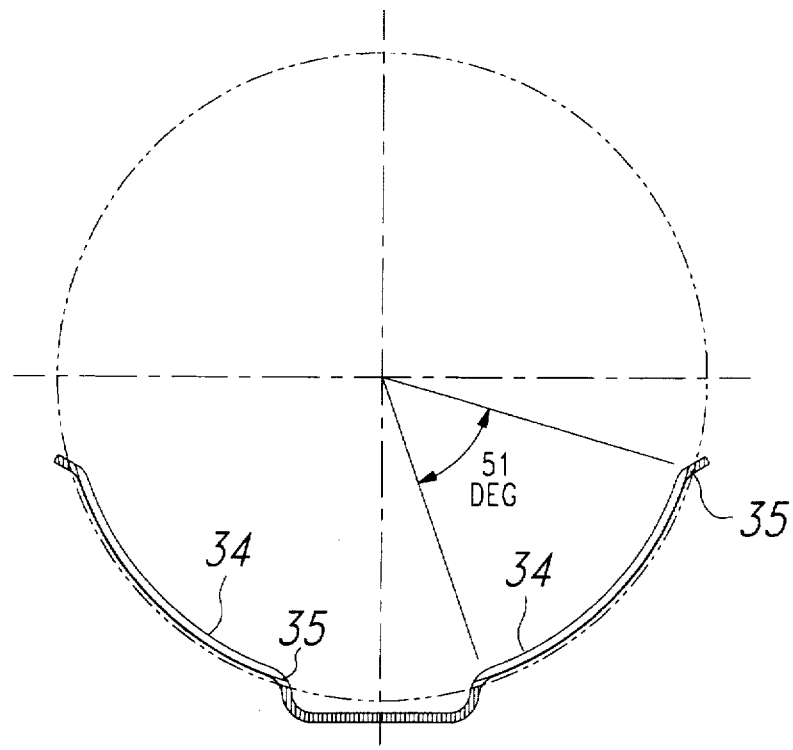
FIG. 3 is a cross-sectional view of another embodiment of the present invention an open-ended wafer carrier having a flattened bottom and two inwardly extending surfaces, each inwardly extending surface having a central concave segment between two convex segments.

FIG. 3 illustrates boat 40 having only two inwardly extending surfaces 34, each of which has a row of slots 35 equally spaced along the longitudinal axis of the cylindrical shell, in contrast to that shown in FIGS. 1 and 4. Note that each inwardly extending surface is partly convex and partly concave, in order to minimize the covered area of each wafer.

Figure 5:
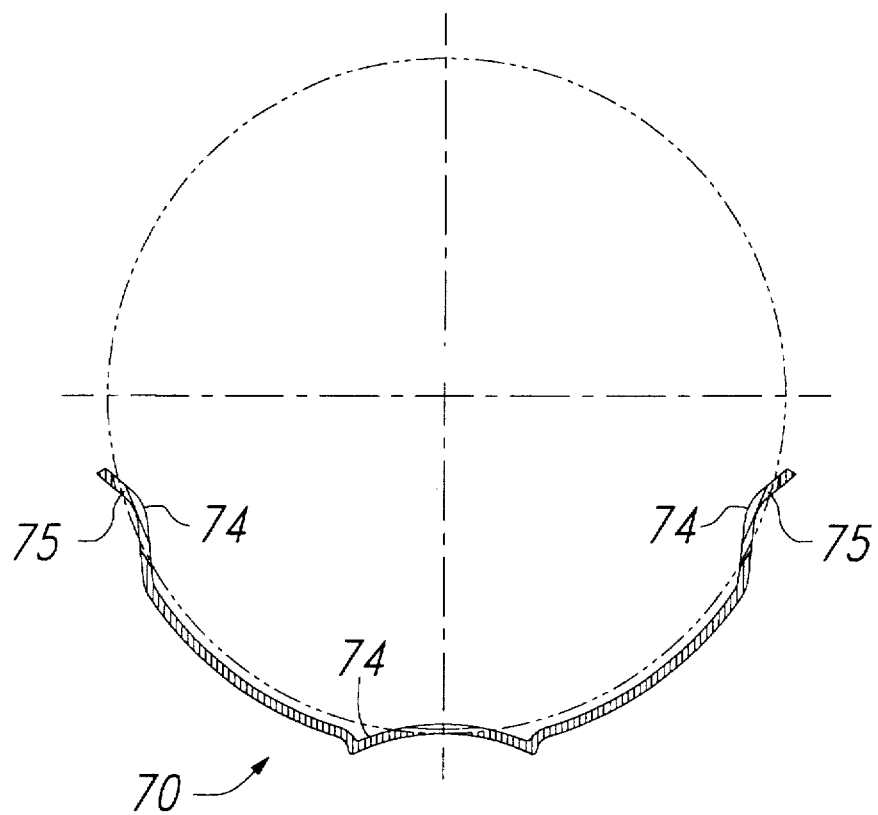
FIG. 5 is a cross-sectional view of another embodiment of the invention, an open-ended boat wherein each wafer is supported by three slots.

FIG. 5 illustrates boat 70 having three inwardly extending surfaces 74, each of which has a row of slots 75 equally spaced along the longitudinal axis of the cylindrical shell. Note that vertical support is provided only by the bottom support point, while each of the other support points is for lateral support or alignment only. In addition, the boat includes segments 76 and 77 which extend outwardly well beyond the radius of the wafers, for the purpose of providing a stable base for the boat.

Preferably at least three slot-containing inwardly convex segments, and more preferably four slot-containing surfaces are provided in the horizontal boats of the present invention. This is the case because:

(1) the bottom two slot-containing surfaces in the four slot-containing boat 20, or the single bottom slot-containing protrusion in the three slot-containing boat 40 shown in FIG. 3, carry the weight of the wafer; and (2) the top two slot-containing surfaces in boats 20 and 40 maintain the position of the wafer in the vertical plane and ensure that each of the wafers is parallel to, and a uniform distance from each of the adjacent wafers.

The thickness of the CVD SiC, "t", should be minimized to reduce the thermal effects on the wafer, yet be thick enough to provide sufficient strength. In the preferred embodiment, this thickness may be in the range of about 0.020 inch to about 0.15 inch or higher. Further t may vary over the body of the boat, due to the nature of the CVD process and/or the requirements of the semiconductor manufacturing process. For instance, it is advantageous to have a thinner CVD SiC thickness at the support points to reduce the thermal effect of the boat on the wafers.

Figure 6:
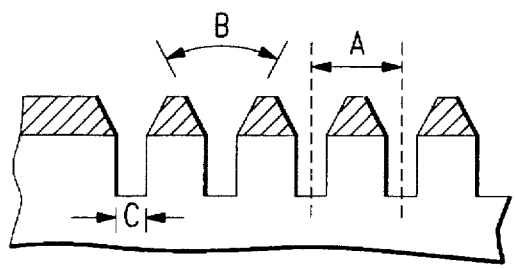
FIG. 6 is a detailed view taken along line 6—6 showing four of the slots of the carrier shown in FIG. 1.

FIG. 6 shows a longitudinal section of equally spaced slots 35. This view is typical for each of slot-containing surfaces 34. Slots 35 are ground or cut into the SiC, generally using a diamond grinding wheel by a process that is common and well known in the commercial grinding of ceramics. Note that if the slot depth, r4 minus r3, is greater than the thickness of the CVD SiC (t), the slots will be cut through the thickness of the CVD SiC as shown in FIGS. 1–5. The width of the slot, "C", is slightly greater than the thickness of the wafers to be supported. The tops of the slots are beveled at an angle, β, to help guide the wafers into slots 35. The dimensions r3, r4, A, C, β, as well as length of the boat and the distance from first end 25 to the first slot 35 in each slot-containing protrusion 34 are defined by common industry standards such as the SEMI standards, by the manufacturers of the semiconductor processing equipment or by the manufacturer of the semiconductor devices.

It may also be advantageous in some cases to vary the profile of the boat over its length. For instance, the preferred embodiment includes a profile in which only the ends of the boat are flattened for use in the support of boat 20. For example, the flattened surface may be for a distance of approximately ½" measured longitudinally from first end 25 and from second end 26 of boat 20. The center section between the first and second ends of boat 20, comprising the greater portion of its length, has the same curvature as cylindrical section 22.

Figure 7:
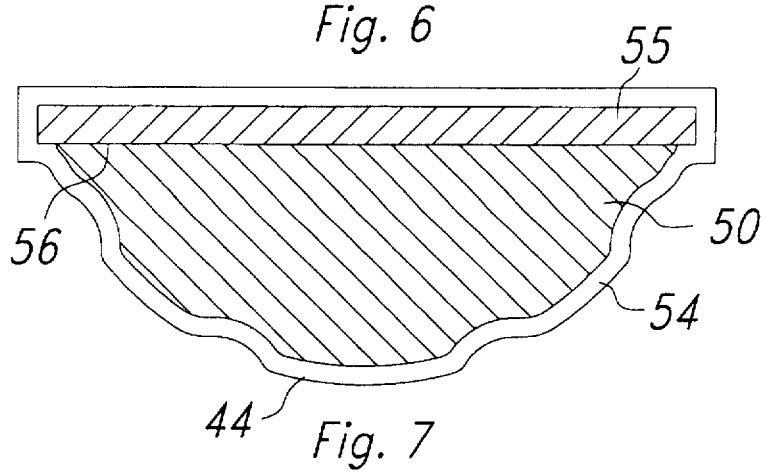
FIG. 7 is a cross sectional view taken through the longitudinal center of a carrier of the present invention in the process of being formed and shows the SiC after deposition onto a form in which a mask is placed over the back of the form.

A cross-section having such a profile is shown at 44 in FIG. 7. The preferred design of the carrier of the present invention provides the flattened surface at either end for support, positioning or lifting, as well as the use of one or more cut outs for minimizing the mass and thermal effects.

While the previously cited references generally refer to high temperature processing of semiconductor devices, the present invention includes the use of the CVD SiC component in operations that are performed at lower temperatures, including room temperature or below. Many cleaning or etching processes take place at these lower temperatures in corrosive or oxidative liquids or gases. In addition to, or in place of, elevated temperatures, these processes may use ultrasonic, plasma or other processing techniques to produce the desired effect on the wafers. CVD SiC wafer boats of the present invention are more stable in these corrosive environments.

Other embodiments of the present invention are contemplated, including but not limited to:

(a) a boat encompassing 180° of a circle with closed ends, which may include a corresponding cover to enclose the wafers;

(b) boats in which areas of the SiC have been indented, cut or ground away to provide access for lifting devices, to reduce mass, to allow for fluid circulation or to allow for the draining of fluids in wet processes; and (c) boats of contiguous design and non-contiguous design, as described in the SEMI standards.

PROCESS FOR MAKING CVD SiC BOAT

Figure 8:
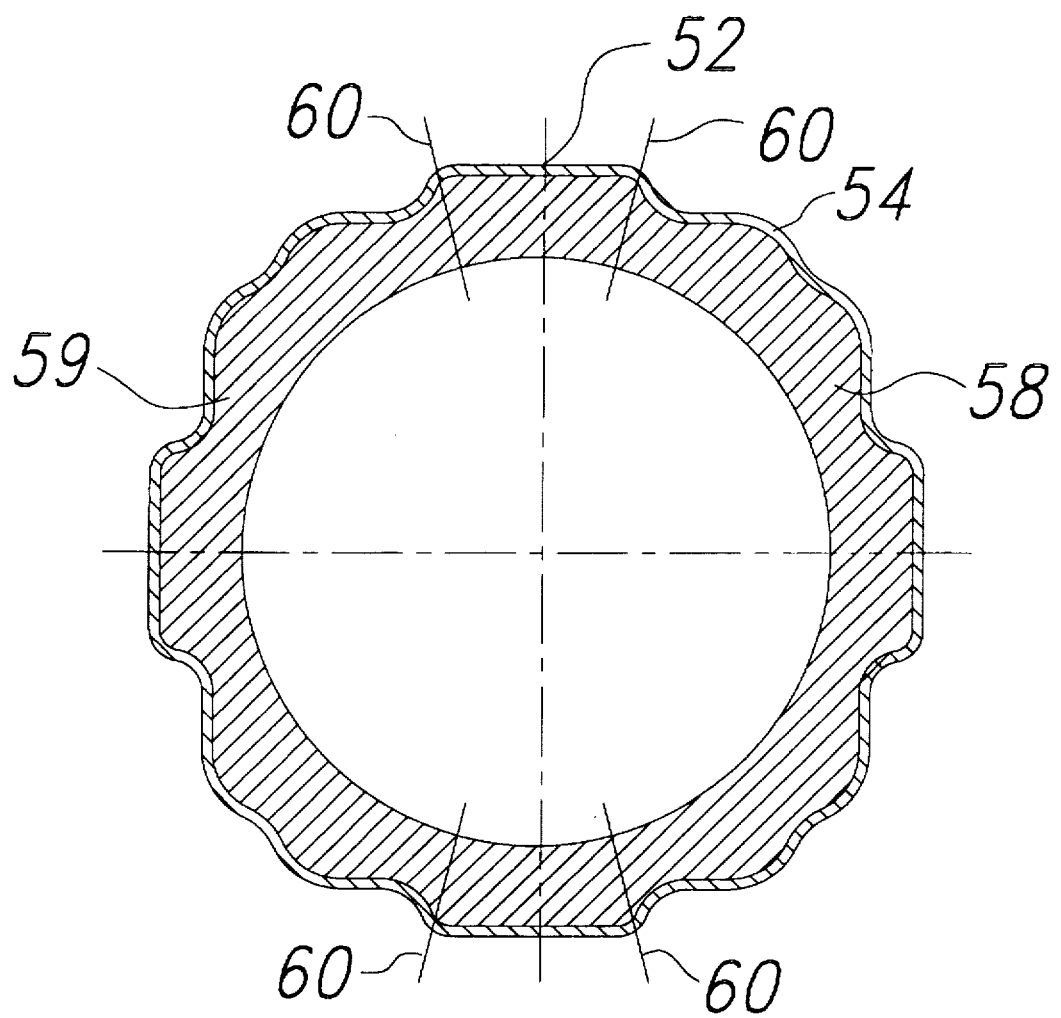
FIG. 8 is an end view of two open-ended carriers of the present invention in the process of being deposited on a cylindrical form before the carriers are removed from the form.

FIGS. 7 and 8 illustrate that in the process of making one or more carriers of the present invention, one or preferably multiple layers 54 of SiC are deposited onto either cylindrical form 50 (FIG. 7) or cylindrical form 52 (FIG. 8). The desired geometric shape of the boat is machined into forms 50 or 52 composed of graphite or other suitable substrate material for coating with CVD SiC. In the preferred embodiment, the graphite is purified using a high temperature chlorine process or other suitable purification process to minimize the content of elements other carbon.

Referring to FIG. 7, mask 55 is placed over back 56 of form 50 to prevent the deposition of SiC. Similarly, the ends of form 50 (not shown) can also be masked to prevent closing the ends when an opened end boat is being made. Alternatively, these areas may be left unmasked, and the subsequently coated surfaces can be ground or cut away to expose the graphite form.

In FIG. 8, the geometric shape of the boat is machined onto both the right cylindrical section 58 and left cylindrical section 59 of cylindrical form 52. A plurality of layers of SiC are deposited onto sections 58 and 59. Cylindrical form 52 is cut or ground longitudinally along the axes 60 and the graphite is removed to yield two boats. In this embodiment of the process of the present invention, the back of the boat is masked by the other boat around the circumference of the cylinder. If forms 50 and 52 are to be removed intact after coating, a release agent may be applied to the outer surfaces of the form to facilitate the separation of the form from the subsequently applied CVD SiC. The process illustrated by FIG. 8 may be varied so that more than two places around the circumference of cylinder 52 are machined in a manner so that more than two boats can be simultaneously manufactured.

Forms 50 and/or 52 are placed in a furnace suitable for applying a CVD SiC coating and a layer of CVD SiC is applied to the form using a chemical vapor deposition process. Suitable processes for applying the CVD SiC coating are well known in the industry. The process generally involves heating the form to a suitable temperature, introducing a gas or combination of gases which contain silicon and carbon atoms, the gases being at, above or below atmospheric pressure and allowing the gases to react to form a silicon carbide layer on the form. The SiC layer may be deposited in single or multiple steps to achieve the desired thickness of silicon carbide. Examples of the suitable processes are described in the previously cited U.S. Pat. Nos. 3,962,391; 4,093,201; 4,203,940; and 4,978,567 and Japanese Patent Publication JP 50-90184.

The masks, if used, are removed to expose the underlying form or, if masks are not used, the CVD SiC coating is cut or ground away from the back and/or ends of the form. The graphite form is then removed intact, or removed by grinding, machining, burning, grit blasting, chemically dissolving or oxidizing, or other suitable method or combination of these methods.

The resulting CVD SiC form is ground, using diamond grinding wheels and/or other commercially available methods of shaping ceramics, to form the slots, to reduce the form to the desired length and width, and to form the base and/or other features of the boat. In some instances it may be advantageous to perform some or all of the grinding prior to removal of the graphite form from the CVD SiC.

In some designs, it may be advantageous to grind holes completely through the CVD SiC, for instance, to provide open areas for gas circulation, for insertion of lifting devices to transport the boats, for the draining of fluids used in cleaning or wet processing, or for other reasons.

The method of the invention produces a boat having essentially the desired final shape, upon completion of the deposition step. Thus, subsequent grinding is required for only 25% or less of the inner and outer surface areas. An especially unique feature of the process is the selective formation of relatively thinner walls in the areas of the carrier where slots are provided to support the wafers.

EXAMPLE

As mold was prepared by machining a hollow graphite cylinder, to shape its outer surface in the exact configuration required for the inner surfaces of two wafer carriers, respectively, one carrier to be formed on one side of the graphite cylinder, and the second carrier to be formed on the opposite side. Since the carriers are designed to hold wafers having a radius of 2.46", the graphite mold was selected to have a slightly larger outer radius of 2.72". Longitudinal concave grooves having a radius of 0.375" were machined into the graphite cylinder, positioned to provide the lower convex inner surfaces of the carriers, and another set of longitudinal concave grooves having a radius of 0.514" were machined into the graphite cylinder, positioned to provide the upper convex inner surfaces of the carriers. The depth of each of the concave grooves machined into the graphite is controlled to provide 0.01" of overlap on the edge of the wafers positioned in the slots to be cut into the convex inner surfaces of the carriers.

The graphite cylinder was purified at 2,000 degrees C with chlorine gas in a purification reactor. The ends of the cylinder were then masked to prevent the coating gases from entering the interior of the cylinder. The masked cylinder was then placed in a CVD reactor and silicon carbide was deposited on the exposed surfaces by the pyrolysis of methyltrichlorosilane. The CVD reactor was designed to rotate the parts to promote uniform coating. The deposition was completed in two separate runs, and the cylinder inverted after the first run. The masks were removed from the ends of the cylinder.

The cylinder was ground, using diamond tools, to the desired length of 3.9375" and the bottom of the carrier forms ground flat at a distance of 2.655" from the desired center of the wafers to be held. The graphite was removed by combustion in air at 1600 degrees F. The wafer slots were ground into the carriers and the carriers separated from each other by grinding with diamond tools. The slots were 0.1" deep, 0.035" wide and on 0.1875" centers.

The top portions of the slots are then beveled to facilitate insertion of the wafers, and exposed corners of the carrier are then chamfered using a diamond grinding wheel.

Without departing from the spirit and scope of this invention, one of ordinary skill in the art can make many other changes and modifications to the wafer carrier of the present invention to adapt it to specific usages and conditions. As such, these changes and modifications are properly, equitably, and intended to be, within the full range of equivalents of the following claims.

For example, when maximum boat strength and durability are required, the preferred embodiment includes a combination of different profiles. That is, each end of the boat is configured to include inwardly convex segments having slots therein to hold wafers; but not to include any segments having a radius substantially greater than the radius of the wafer to be carried in the boat. Referring to FIG. 5, for example, each end of such a boat includes segments 74 having slots 75; but does not include segments 76 and 77. The remainder of such a boat, except for the ends, has the same cross-section as in FIG. 5. This still provides an adequate base for the boat, while minimizing its susceptibility to breakage, because the ends normally receive more accidental impact stress from careless handling, than does the remainder of the boat.

What is claimed is:

1. A carrier for holding semiconductor wafers, consisting of a single piece of silicon carbide having a purity of at least 99.99% and a bulk density of at least 3.18 grams per cubic centimeter, said carbide having the shape of a generally cylindrical shell section having an average radius greater than the radius of the wafers to be held, the inner concave surface of said shell having at least two convex longitudinal segments extending inwardly to within a shell radius significantly less than the radius of the wafers to be held, said inner convex segments having a plurality of orthogonal slots therein to support the wafers for processing.

2. The carrier of claim 1 wherein said inner convex longitudinal segments have a uniform curvature across their entire width, except for the shoulders thereof, where said segments merge with the remainder of carrier shell.

3. The carrier of claim 1 wherein said inner convex longitudinal segments have a non-uniform curvature, including a portion shaped to minimize the area of each wafer covered by the slot walls.

4. The carrier of claim 1 wherein at least one open area is formed in said shell, in addition to said grooves.

5. The carrier of claim 1 wherein said cylindrical shell subtends an arc ranging from approximately 90° to approximately 180°.

6. The carrier of claim 1 wherein said convex inwardly extending segments subtend an arc ranging from approximately 5° to approximately 60°.

7. The carrier of claim 1 having three inwardly convex segments.

8. The carrier of claim 1 having four inwardly convex sections.

9. The carrier of claim 1 wherein the outer longitudinal surface contains at least one flattened section used to form a carrier base.

10. The carrier of claim 1 wherein the thickness of the shell is substantially uniform throughout, except for the slot walls, which are substantially thinner.

11. The carrier of claim 1 wherein the ends of the shell have fewer changes in curvature than the remaining portions of the shell, in order to provide relatively greater strength in the end portions.

* * * * *